(12) United States Patent
Polnyi

(10) Patent No.: US 7,527,503 B1
(45) Date of Patent: May 5, 2009

(54) SOCKET FOR INTEGRATED CIRCUIT WITH PIVOTAL ALIGNING KEY

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/009,476

(22) Filed: Jan. 18, 2008

(51) Int. Cl.
*H01R 12/00* (2006.01)

(52) U.S. Cl. ........................................................ 439/71

(58) Field of Classification Search ................. 439/681, 439/680, 70, 71
See application file for complete search history.

(56) References Cited

U.S. PATENT DOCUMENTS

| | | | |
|---|---|---|---|
| 6,164,980 A * | 12/2000 | Goodwin | 439/70 |
| 6,702,588 B1 * | 3/2004 | McHugh et al. | 439/71 |
| 6,786,738 B2 * | 9/2004 | Lin | 439/71 |
| 6,908,316 B2 | 6/2005 | Ma et al. | |
| 6,929,505 B2 * | 8/2005 | He et al. | 439/526 |
| 7,083,456 B2 | 8/2006 | Trout et al. | |
| 7,207,808 B2 | 4/2007 | Ma | |
| 2007/0054514 A1 * | 3/2007 | Long et al. | 439/70 |

* cited by examiner

*Primary Examiner*—Phuong K Dinh
(74) *Attorney, Agent, or Firm*—Wei Te Chung

(57) ABSTRACT

A socket connector, for electrically connecting a package and a PCB (Print Circuit Board), comprises a plurality of contacts, an insulative housing receiving the contacts, a metal stiffener, a clip and a lever. The insulative housing defines a receiving space for the package and has a location keys besides the receiving space. The location key has a cantilever arm linking with the peripheral wall and a header portion on a free end of the cantilever arm, and the cantilever arm can deflect inwardly and bring the header portion to enter and be locked in the receiving space.

7 Claims, 5 Drawing Sheets

SOCKET FOR INTEGRATED CIRCUIT WITH PIVOTAL ALIGNING KEY

BACKGROUND OF THE INVENTION

1. Field of the Invention

The present invention relates to an insulative housing for a socket connector, which is used for connecting an electronic package, such as a central processing unit (CPU), with a circuit substrate, such as a print circuit board (PCB).

2. Description of the Prior Art

Socket connectors are widely used in electrically connecting a package and a PCB. Since the package must be seated in the socket connector in a certain orientation, otherwise the package will not normally work and the socket connector may be destroyed by package. In order to ensure the package is correctly placed in the socket connector, the package has cutouts, and a housing of the socket connector for receiving the package, correspondingly integrally forms a plurality of location keys to engage with the cutouts on the package. Examples for this kinds electrical connectors are disclosed in U.S. Pat. Nos. 7,083,456, 6,908,316 and 6,164,980. However, the location keys are near to the passageways for the contacts, so the location keys may influence insertions of corresponding contacts. Furthermore, the location keys are integral with the housing and changeless in position, the socket connector only can receive one given type package.

U.S. Pat. No. 7,207,808 issued to Ma on Apr. 24, 2007 discloses an improved socket connector. The socket connector of Ma '848 comprises an insulative housing 10 defining a plurality of passageways 12 and two recessed areas 110 corresponding to two cutouts on the package, a plurality contacts and two detachable keys 16. After the contacts insert into the corresponding passageways 12, the detachable keys 16 are assembled to the insulative housing 10 by inserting into the recessed areas 110, and will not influence the assembly of the contacts. But the location keys 16 are separated from the insulative housing 10, so additional workings are needed to manufacture the location key 16 and assemble the locations keys 16 to the insulative housing 10, that will be time-consuming process and therefore increase the manufacturing cost.

Accordingly, a socket connector that solves the above problems is desirable. flint

SUMMARY OF THE INVENTION

Accordingly, an object of the present invention is to provide a socket connector, which has an insulative housing with movable location keys.

To fulfill the above object, a socket connector, for electrically connecting a package with a plurality of cutouts and a PCB (Print Circuit Board), comprises an insulative housing having a base defining a supporting surface and a mounting surface with a plurality of passageways defined therebetween, sidewalls extending from edges of the base with at least one location key moveable from a first position, in which the location key is located within the sidewall, and a second position, in which a portion of the location key extends into a position above the supporting surface, and a plurality of contact terminals assembled into the passageways when the location key is located in the first position.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Socket connectors are widely used for connecting a package to a PCB, and configuration of a conventional socket connector is known to all persons in this field, which comprises an insulative housing for receiving the package, a plurality of contacts installed in the insulative housing, a metal stiffener for laying and surrounding the insulative housing, a clip rotatablely assembled to the metal stiffener for covering the package and a lever assembled on the metal stiffener to latch the chip. A socket connector according to the present invention is similar with a conventional connector, comprising an insulative housing, contacts, a metal stiffener, a clip and a lever, except detailed structures on an insulative housing, so only sketch maps of the insulative housing are shown here, another parts of the socket connector will not be shown or be described, and that will not influence enforceability of present invention.

Figure 1:
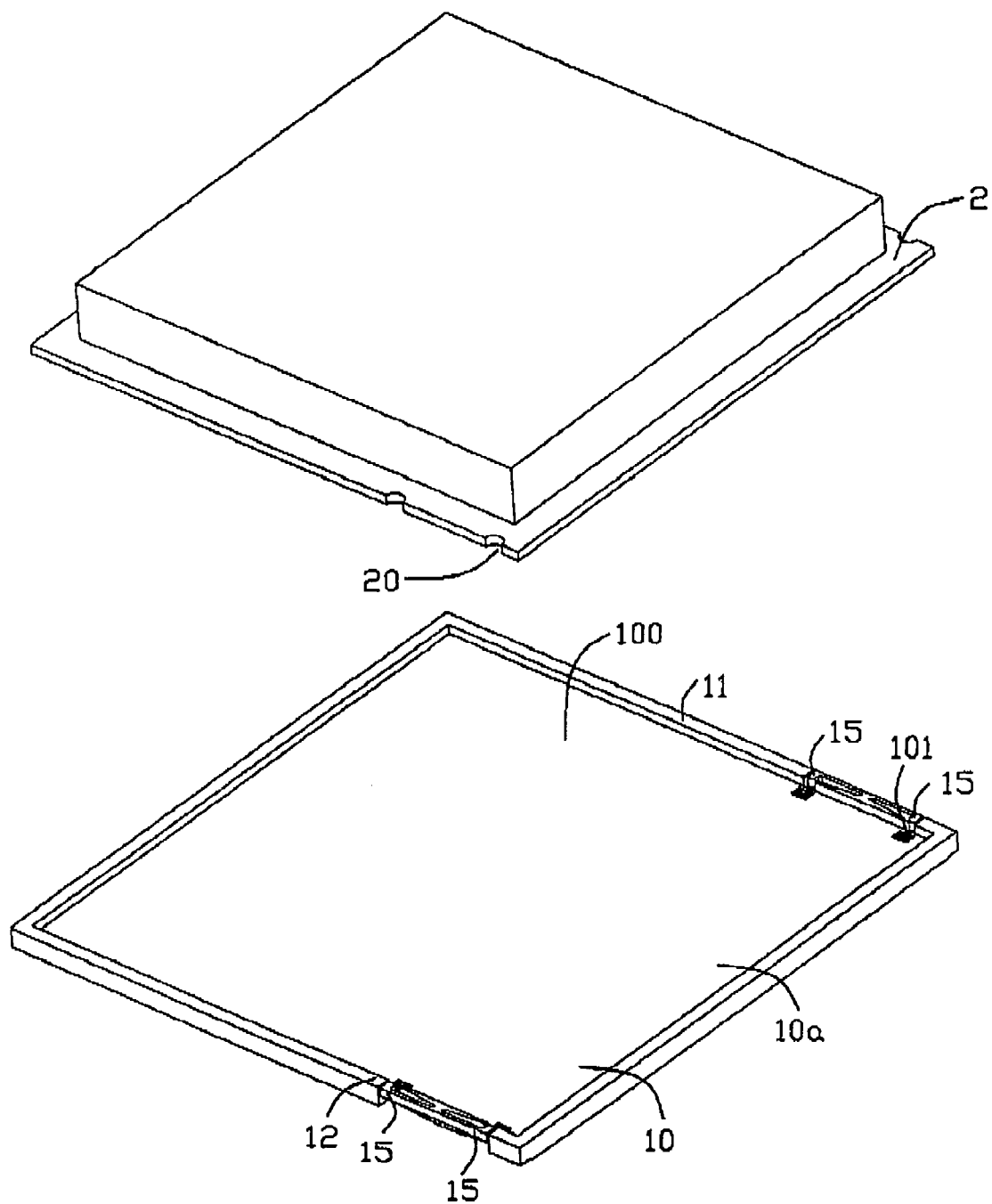
FIG. 1 is a sketch map of an insulative housing for a socket connector in a preferred embodiment according to the present invention and a package.
Figure 2:
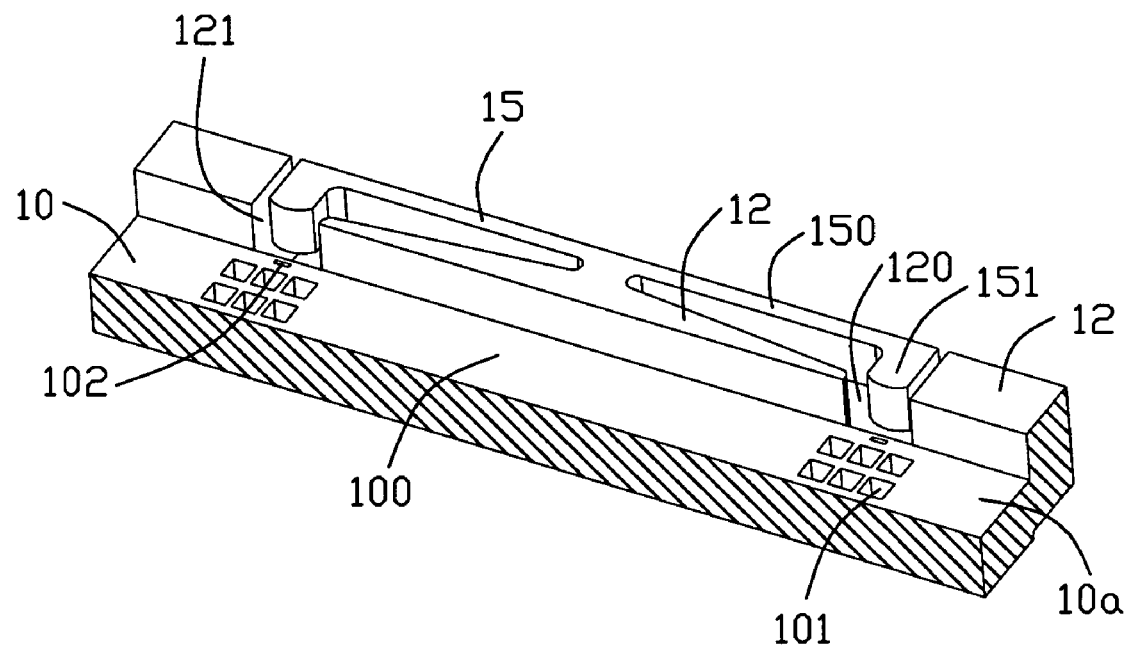
FIG. 2 is a perspective view of a part of the insulative housing, showing a pair of location keys.
Figure 3:
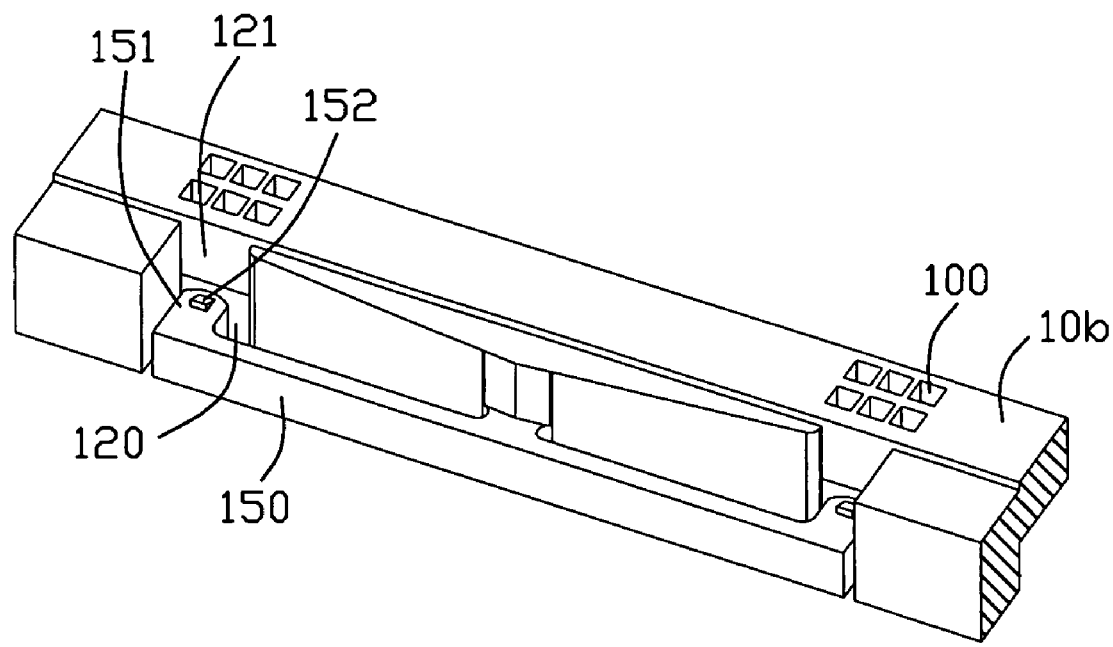
FIG. 3 is another perspective view of the part of the insulative housing in FIG. 2, taken from a bottom side.
Figure 4:
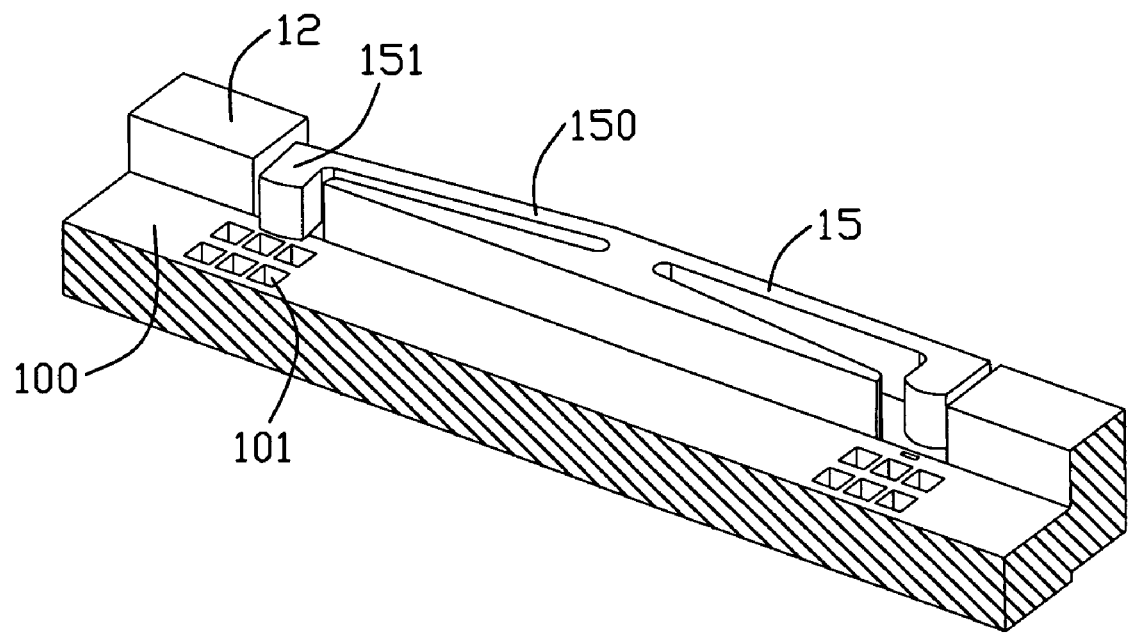
FIG. 4 is similar to FIG. 2, but one of the location key is locked.

Referring to FIGS. 1-3, the insulative housing is substantially a rectangle base 10 with a peripheral wall 11 upwardly extending from edges thereof. The base 10 and the peripheral wall 11 together define a receiving space 100 in a center of the insulative housing for accommodating a package 2. The base 10 defines a supporting face 10a and a mounting face 10b. The base 10 defines a plurality of contact passageways 101 (only several ones are shown) downwardly through the supporting face 10a and the mounting face 10b. The passageway 101 is used to accommodate corresponding contact (not shown). The peripheral wall 11 has four sidewalls 12, and two opposed sidewalls 12 are respectively formed with two location keys 15 thereof, which will be described in detail hereafter.

The location key 15 is substantially in an L-shape, and comprises a cantilever arm 150 extending along the sidewall 12 and a header portion 151 vertically protruding from an end of the cantilever arm 150 and toward the receiving space 100. The other end of the cantilever arm 150 is linked with the sidewall 12. Referring to FIG. 3, an outside face of the cantilever arm 150 is approximate coplanar with an outside face of the sidewall 12.

A part of the sidewall 12 faced to the cantilever arm 150 gradually become narrow, along a direction from the end of the cantilever arm 150 linking with the sidewall 12 toward the header portion 151, so that a room 120 is defined between the sidewall 12 and the cantilever arm 150 for allowing the cantilever arm 150 to deflect inside toward the receiving space 100. The sidewall 12 further defines a gap 121 face to the header portion 151 of the location key 15, so the header portion 151 can pass through the gap 151 and insert into the receiving space 100.

Referring to FIG. 3, the header portion 151 of the location key 15 is provided with a wedge portion 152 projecting from a bottom face thereof and near an inner side thereof. The base 10 correspondingly defines a recess 102 besides the contact passageways 101. To ensure the cantilever arm 150 have enough elasticity, a thickness of the cantilever arm 150 is thinner than that of the sidewall 12.

At first, the location keys 15 are at a first position, at which the location key 15 is out of the receiving space 100 and within the sidewall, the contacts (not shown) can easily insert into the contact passageways 101 without any trouble, then, the cantilever arm 150 is pushed to deflect inside toward the receiving space 100, the header portion 151 passes through the gap 121 to partially enters into the receiving space 100 and be above the supporting surface 10a, furthermore, the wedge portion 152 engages with the recess 102 on the base 10 and locks with the header portion 151, that is a second position of the location key 15, at this situation, the header portion 152 is very closer to the contact passageways 100. After that, the package 2 can be correctly inserted into the insulative housing by a cutout 20 defined on a side of the package 2 receiving the header portion 151.

Figure 5:
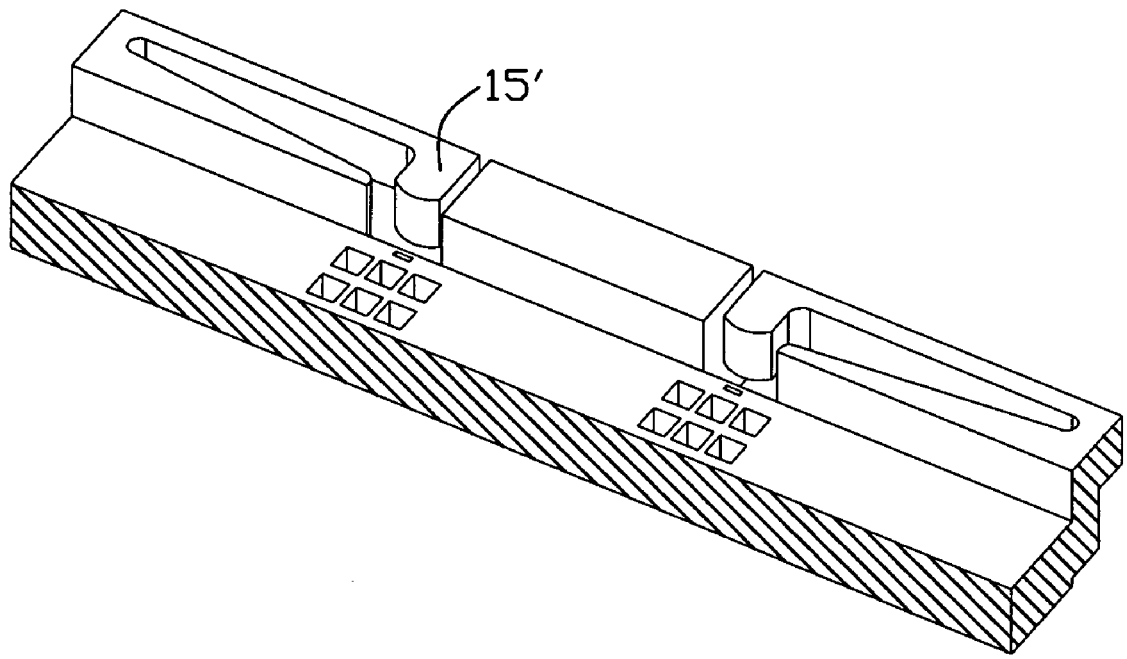
FIG. 5 is a sketch map of a part of the insulative housing in another embodiment.

FIG. 5 shows two location keys 15' in another embodiment, the difference is that two cantilever arms in this embodiment extend toward each other, so two header portion are near to each other, that may be adapted for a package (not shown) with two closer cutouts.

In fact, different type-packages define cutouts on different positions on lateral edges thereof, so the insulative housing in the present invention can be provided with a plurality of location keys 15, though only four ones are shown in the preferred embodiment, and according to positions and a number of cutouts on the package which will engages with the socket connector, corresponding location keys are chosen to be pushed to deflect inside. In other words, the insulative housing with a plurality of the location keys can engage with different packages in different type.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An insulative housing for a package with at least one cutout, comprising:
   a base defining a supporting surface and a mounting surface with a plurality of passageways defined therebetween; and
   peripheral wall extending from edges of the base, and defining a receiving space together with the base, the peripheral wall having at least one location key moveable from a first position, in which the location key stays outside the receiving space, to a second position, in which a portion of the location key is retained in the receiving space for engaging with the cutout of the package, wherein the location key has a cantilever arm linking with the peripheral wall and a header portion on a rice end of the cantilever arm, and wherein the cantilever arm is capable of deflecting inside, toward the receiving space to bring the header portion at least partially entering in the receiving space and being, wherein the header portion is formed with a wedge portion on a bottom face thereof, the base defines a recess according to the wedge portion, when the header portion enters into the receiving space, the wedge portion drops into the recess and be locked with the recess to keep the location key in the second position, wherein the recess is beside and closer to the contact passageway on the base.

2. The insulative housing of claim 1, wherein the location key arrives to the second position before insertion of the package to engage with the cutout of the package.

3. The insulative housing of claim 1, wherein the peripheral wall has a part which is disposed between the cantilever arm and the receiving space, the part of the peripheral wall gradually thinner to define a room for allowing the cantilever arm to deflect inside toward the receiving space.

4. The insulative housing of claim 1, wherein the peripheral wall defines a gap face to the header portion for the header portion passing through.

5. The insulative housing of claim 1, wherein the peripheral wall is integrally formed with a plurality of the location keys, and the package is formed with a plurality of the cutouts, the location keys are chosen to be pushed into the receiving space to be locked at the second position according to the cutouts on the package.

6. A socket connector, for electrically connecting a package with a plurality of cutouts and a PCB (Print Circuit Board), comprising:
   an insulative housing having a base defining a supporting surface and a mounting surface with a plurality of passageways defined therebetween; the housing defining sidewalls extending from edges of the base, and the sidewalls and the base together defining a receiving space, the sidewall having at least one location key moveable from a first position, in which the location key is in an original state and whole outside the receiving space, and a second position, in which a portion of the location key moves toward the receiving space from the first position and be retained to a position above the supporting surface for engaging with the cutout of the package; and
   a plurality of contact terminals assembled into the passageways when the location key is located in the first position, wherein the location key has a cantilever arm linking with the side wall and a header portion on a free end of the cantilever arm, the cantilever arm is capable of deflecting inside toward the receiving space and bringing the header portion partially entering in the receiving space, wherein the header portion is formed with a wedge portion on a bottom face thereof, the base defines a recess according to the wedge portion, when the header portion is pushed into the receiving space, the wedge portion is dropped on the recess and locks with the header portion, so the header portion is positioned in the receiving space, wherein the location keys are chosen to be pushed into the receiving space, according to positions and a number of the cutouts on the package, to engage with the cutouts of the package, wherein the socket connector further comprising a metal stiffener laying and surrounding the insulative housing, a clip rotatably assembling to the metal stiffener and a lever assembled on the metal stiffener to retain the clip.

7. An electrical connector comprising:
   a peripheral wall surrounding a central cavity for receiving therein an electronic component which is adapted to be downwardly loaded into said central cavity;
   a plurality of contacts disposed in a bottom base of an insulative housing with mating portions upwardly extending into the central cavity;
   a moveable location key associated with the peripheral wall, and back and forth moved with regard to the peripheral wall under a condition that the location key is moved to an outer position before loading the electronic component into the central cavity while successively is moved to an inner position for engaging with and retaining said electronic component in position, the outer position being away form a center of the central cavity compared with the inner position, wherein said peripheral wall is integrally formed with said location key, wherein the location key is positioned and dimensioned for being received in a cutout of the electronic component, wherein said location key is moved horizontally only, wherein said location key is in a relaxed mariner at the outer position while in a tensioned manner at the inner position, including a holding device to retain said location key in said inner position, wherein said holding device includes one part formed on the locating key and the other part formed on the bottom base of the housing.

* * * * *